United States Patent
Dill et al.

[11] Patent Number: 6,114,719
[45] Date of Patent: *Sep. 5, 2000

[54] MAGNETIC TUNNEL JUNCTION MEMORY CELL WITH IN-STACK BIASING OF THE FREE FERROMAGNETIC LAYER AND MEMORY ARRAY USING THE CELL

[75] Inventors: Frederick Hayes Dill, South Salem, N.Y.; Robert Edward Fontana, Jr., San Jose, Calif.; Tsann Linn, Saratoga, Calif.; Stuart Stephen Papworth Parkin, San Jose, Calif.; Ching Hwa Tsang, Sunnyvale, Calif.

[73] Assignee: International Business Machines Corporation, Armonk, N.Y.

[*] Notice: This patent is subject to a terminal disclaimer.

[21] Appl. No.: 09/087,553

[22] Filed: May 29, 1998

[51] Int. Cl.$^7$ .................................................. H01L 29/76
[52] U.S. Cl. .......................... 257/295; 257/421; 257/422; 257/423; 257/424; 257/425; 257/426; 257/427; 365/171; 365/173; 365/158
[58] Field of Search ........................... 257/295, 421–427; 365/171, 173, 158

[56] References Cited

U.S. PATENT DOCUMENTS

| | | | |
|---|---|---|---|
| 5,640,343 | 6/1997 | Gallagher et al. | 365/171 |
| 5,650,958 | 7/1997 | Gallagher et al. | 365/173 |
| 5,729,410 | 3/1998 | Fontana, Jr. et al. | 360/113 |
| 5,841,692 | 11/1998 | Gallagher et al. | 365/173 |
| 5,864,498 | 1/1999 | Womack | 365/173 |
| 5,936,293 | 8/1999 | Parkin | 257/422 |
| 5,966,012 | 10/1999 | Parkin | 324/252 |
| 5,966,323 | 10/1999 | Chen et al. | 365/158 |
| 5,982,660 | 11/1999 | Bhattacharyya et al. | 365/173 |

*Primary Examiner*—David Hardy
*Assistant Examiner*—Matthew Warren
*Attorney, Agent, or Firm*—Thomas R. Berthold

[57] ABSTRACT

A magnetic tunnel junction (MTJ) memory cell uses a biasing ferromagnetic layer in the MTJ stack of layers that is magnetostatically coupled with the free ferromagnetic layer in the MTJ stack to provide transverse and/or longitudinal bias fields to the free ferromagnetic layer. The MTJ is formed on an electrical lead on a substrate and is made up of a stack of layers. The layers in the MTJ stack are an antiferromagnetic layer, a fixed ferromagnetic layer exchange biased with the antiferromagnetic layer so that its magnetic moment cannot rotate in the presence of an applied magnetic field, an insulating tunnel barrier layer in contact with the fixed ferromagnetic layer, a free ferromagnetic layer in contact with the tunnel barrier layer and whose magnetic moment is free to rotate in the presence of an applied magnetic field, and whose moment, in the absence of any applied field, is generally either parallel or antiparallel to that of the fixed ferromagnetic layer, a biasing ferromagnetic layer that has its magnetic moment aligned generally in the plane of the MTJ, and a nonferromagnetic electrically conductive spacer layer separating the biasing ferromagnetic layer from the other layers in the stack. The self field or demagnetizing field from the biasing layer magnetostatically couples with the edges of the free layer so as to provide a transverse bias field, which results in a coherent rotation of the moment of the free layer, and/or a longitudinal bias field, which assures that the two states of the memory cell are equally stable with respect to magnetic field excursions.

37 Claims, 8 Drawing Sheets

MAGNETIC TUNNEL JUNCTION MEMORY CELL WITH IN-STACK BIASING OF THE FREE FERROMAGNETIC LAYER AND MEMORY ARRAY USING THE CELL

RELATED APPLICATIONS

This application is related to application Ser. No. 09/087,334 titled "MAGNETIC TUNNEL JUNCTION MAGNETORESISTIVE SENSOR WITH IN-STACK BIASING" and application Ser. No. 09/087,322 titled "MAGNETIC TUNNEL JUNCTION MAGNETORESISTIVE READ HEAD WITH LONGITUDINAL AND TRANSVERSE BIAS", now U.S. Pat. No. 6,005,753 both filed concurrently with this application.

The United States Government has a paid-up license in this invention and the right in limited circumstances to require the patent owner to license others on reasonable terms as provided for by the terms of contract No. MDA 972-96-C0014.

TECHNICAL FIELD

This invention relates in general to magnetic tunnel junction (MTJ) devices for memory applications. More particularly the invention relates to a MTJ memory cell with biasing of the magnetic moment of the free or sensing ferromagnetic layer in the MTJ provided by an additional in-stack ferromagnetic layer.

BACKGROUND OF THE INVENTION

A magnetic tunnel junction (MTJ) device is comprised of two ferromagnetic layers separated by a thin insulating tunnel barrier layer and is based on the phenomenon of spin-polarized electron tunneling. One of the ferromagnetic layers has a higher saturation field in one direction of an applied magnetic field, typically due to its higher coercivity than the other ferromagnetic layer. The insulating tunnel barrier layer is thin enough that quantum mechanical tunneling occurs between the ferromagnetic layers. The tunneling phenomenon is electron-spin dependent, making the magnetic response of the MTJ a function of the relative orientations and spin polarizations of the two ferromagnetic layers.

MTJ devices have been proposed as memory cells for solid state memory and as external magnetic field sensors, such as magnetoresistive (MR) read sensors or heads for magnetic recording systems. The use of a MTJ device as a memory cell in a nonvolatile magnetic random access memory (MRAM) array is described in IBM's U.S. Pat. Nos. 5,650,958 and 5,640,343.

The response of the MTJ device is determined by measuring the resistance of the MTJ when a sense current is passed perpendicularly through the MTJ from one ferromagnetic layer to the other. The probability of tunneling of charge carriers across the insulating tunnel barrier layer depends on the relative alignment of the magnetic moments (magnetization directions) of the two ferromagnetic layers. The tunneling current is spin polarized, which means that the electrical current passing from one of the ferromagnetic layers, for example, a ferromagnetic layer whose magnetic moment is fixed or prevented from rotation, is predominantly composed of electrons of one spin type (spin up or spin down, depending on the orientation of the magnetic moment of the ferromagnetic layer). The degree of spin polarization of the tunneling current is determined by the electronic band structure of the magnetic material comprising the ferromagnetic layer at the interface of the ferromagnetic layer with the tunnel barrier layer. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. The tunneling probability of the charge carriers is highest when the magnetic moments of both layers are parallel, and is lowest when the magnetic moments are antiparallel. Thus, the electrical resistance of the MTJ depends on both the spin polarization of the electrical current and the electronic states in both of the ferromagnetic layers.

For a memory cell application one of the ferromagnetic layers in the MTJ has its magnetic moment fixed or pinned so as to be either parallel or antiparallel to the magnetic moment of the other free or sensing ferromagnetic layer in the absence of an applied magnetic field within the cell. It is thus necessary to be able to distinguish the two states of the MR memory device, i.e., parallel and antiparallel alignment of the moment of the free ferromagnetic layer with the moment of the fixed ferromagnetic layer. However, if when changing the state of the memory cell, the magnetic moment of the free layer is switched from one direction to the opposite direction by the formation of magnetic domains or inhomogeneous magnetic structures in the free layer, the speed of writing the new state of the cell is decreased compared to the case in which the moment of the free layer is uniformly rotated from one direction to the other without the formation of magnetic domains. Moreover, when magnetic domains are formed in the free layer it is possible that not all of these magnetic domains are removed when the magnetic fields applied during the writing of the new state of the cell are removed. Thus the magnitude of the moment of the free layer may be reduced after its state has been re-written, which can lead to a diminishment of the difference in resistance between the two states of the cell and in a consequent increase in the time required to read the state of the cell with the same precision. If some means is not used to stabilize the free ferromagnetic layer of the MTJ, i.e., to maintain it in a single magnetic domain state, then the performance of the memory cell will be degraded with respect to both writing and reading.

The problem of maintaining a single magnetic domain state is especially difficult in the case of a MTJ memory cell because, unlike a MTJ MR sensor, it is not possible to add additional magnetic structures adjacent to the device without reducing the density of the memory array. Thus the method of longitudinally biasing a MTJ MR device, which is described in IBM's U.S. Pat. No. 5,729,410, by adding electrically isolated ferromagnetic biasing regions outside the MTJ stack is not suitable for high density memory applications.

What is needed is a MTJ memory cell that has two reproducible magnetic states in which the magnetic moment of the free ferromagnetic layer is either parallel or antiparallel to the magnetic moment of the fixed ferromagnetic layer and for which the magnetic moment of the free layer rotates coherently between these two states.

SUMMARY OF THE INVENTION

The invention is a MTJ memory cell with one fixed ferromagnetic layer and one free ferromagnetic layer on opposite sides of the tunnel barrier layer, and with a biasing ferromagnetic layer in the MTJ stack of layers that is magnetostatically coupled with the free ferromagnetic layer to provide transverse and/or longitudinal bias fields to the free ferromagnetic layer. The MTJ is formed on an electrical lead on a substrate and is made up of a stack of layers. The layers in the MTJ stack are an antiferromagnetic layer, a fixed ferromagnetic layer exchange biased with the antiferromagnetic layer so that its magnetic moment cannot rotate in the presence of an applied magnetic field, an insulating tunnel barrier layer in contact with the fixed ferromagnetic layer, a free ferromagnetic layer in contact with the tunnel barrier layer and whose magnetic moment is free to rotate in the presence of an applied magnetic field, and whose moment, in the absence of any applied field, is generally either parallel or antiparallel to that of the fixed ferromagnetic layer, a biasing ferromagnetic layer that has its magnetic moment aligned generally in the plane of the MTJ, and a nonferromagnetic electrically conductive spacer layer separating the biasing ferromagnetic layer from the other layers in the stack. When the magnetic moment of the biasing layer is oriented generally orthogonal to the moment of the fixed layer, the self field or demagnetizing field from the biasing layer magnetostatically couples with the edges of the free layer so as to provide a transverse bias field which results in a coherent rotation of the moment of the free layer when the memory cell is subjected to write fields. In addition, the magnetic moment of the biasing layer can be oriented at an angle other than orthogonal to the moment of the fixed layer to also provide a longitudinal bias field so that the two states of the memory cell are equally stable with respect to magnetic field excursions. The electrically conductive spacer layer prevents direct ferromagnetic coupling between the biasing layer and the other layers in the stack while allowing sense current to flow perpendicularly through the layers in the MTJ stack. The biasing layer may be a single relatively high coercivity material, a bilayer of a first lower coercivity ferromagnetic film and a second higher coercivity ferromagnetic film, or a ferromagnetic film interfacially exchange coupled to an antiferromagnetic film.

For a fuller understanding of the nature and advantages of the present invention, reference should be made to the following detailed description taken together with the accompanying figures.

DETAILED DESCRIPTION OF THE INVENTION

Prior Art

Figure 1A:
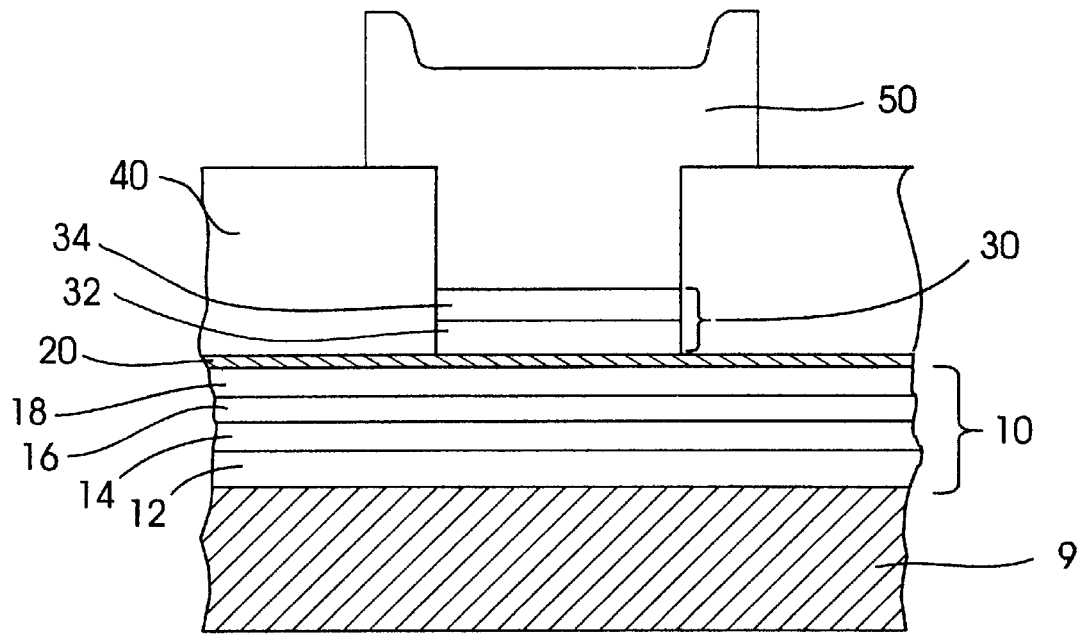
FIGS. 1A and 1B show a cross-section view and a top view, respectively, of a MTJ memory cell according to the previously-cited IBM '958 patent, with a self-aligned contact hole through the insulating material surrounding the MTJ stack.
Figure 1B:
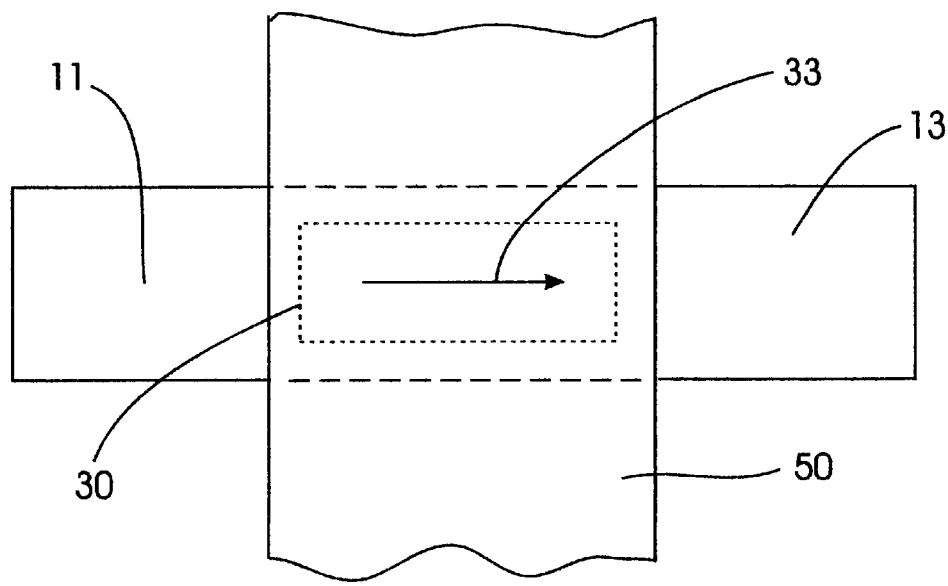

For purposes of understanding the present invention, the MTJ devices described in IBM's U.S. Pat. Nos. 5,650,958 and 5,640,343 will first be described with reference to FIGS. 1. FIGS. 1A–1B illustrate schematically a MTJ structure suitable for a magnetic memory cell application, as described in IBM's U.S. Pat. Nos. 5,650,958 and 5,640,343. The structure, shown in cross-section in FIG. 1A and from a top view in FIG. 1B, comprises a substrate 9, a base electrode multilayer stack 10, an insulating tunnel barrier layer 20, a top electrode stack 30, an insulating layer 40 with a contact hole through it, and a contact and top wiring layer 50 that itself may be a multilayer structure. The tunnel barrier layer 20 is sandwiched between the two ferromagnetic layer stacks 10 and 30.

The base electrode layer stack 10 formed on substrate 9 includes a first seed layer 12 deposited on substrate 9, a "template" ferromagnetic layer 14 on the seed layer 12, a layer of antiferromagnetic material 16 on the template layer 14, and a "pinned" ferromagnetic layer 18 formed on and exchange coupled with the underlying antiferromagnetic layer 16. The ferromagnetic layer 18 is called the pinned layer because its magnetic moment (magnetization direction) is prevented from rotation in the presence of applied magnetic fields in the desired range of interest for the MTJ device. The top electrode stack 30 includes a "free" ferromagnetic layer 32 and a protective layer 34 formed on the free layer 32. The magnetic moment of the ferromagnetic layer 32 is not pinned by exchange coupling, and is thus free to rotate in the presence of applied magnetic fields in the range of interest, i.e., magnetic fields caused by the write current. Both of the ferromagnetic layers 18 and 32 in electrode stacks 10 and 30, respectively, are fabricated so as to have their easy axes of magnetization generally parallel to one another in the same direction parallel to the length of the bottom wiring layer, which is formed as the extensions 11, 13 of base electrode 10 (FIG. 1B). This direction is shown by the arrow 33 in FIG. 1B. The insulating layer 40 has a self-aligned contact hole through to the top of the top junction electrode stack 30. The pinned ferromagnetic layer 18 in stack 10 just beneath the tunnel barrier layer 20 has its magnetization pinned by interfacial exchange coupling with the immediately underlying antiferromagnetic layer 16, which also forms part of base electrode stack 10. For magnetic fields of magnitude comparable to those applied to the memory cell during read and write operations of the cell, there is only one possible orientation for the magnetization of the pinned ferromagnetic layer 18. The free ferromagnetic layer 32 in top electrode stack 30 is anisotropic in its magnetization properties, but its magnetization direction or vector is not pinned. Rather, its magnetization vector can be stably oriented along either direction of the easy axis by the application of a magnetic field in the desired range.

Figure 1C:
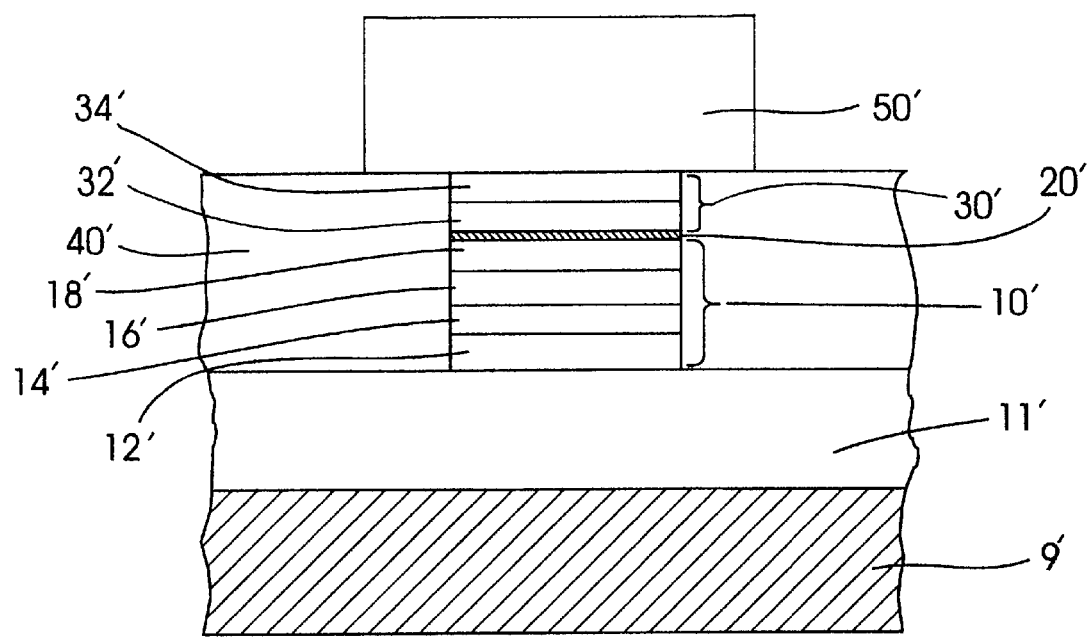
FIG. 1C shows a cross-section view of a MTJ memory cell like that of FIG. 1A, but with a planarized, self-aligned contact hole and all of the layers of the MTJ having the same contiguous side edges.

FIG. 1C illustrates the cross-section of a MTJ memory cell similar to that of FIG. 1A except that the base electrode stack 10', the insulating tunnel barrier 20', and the top electrode stack 30' all have the same cross-sectional area. The base electrode stack 10' is formed on wiring lead 11' that is formed on the substrate 9. The insulating layer 40' surrounds the entire MTJ device and extends down to lead 11'. This structure allows for the memory cell to be readily fabricated on top of electronic devices, such as a diode or transistor, for manipulating sense current through the individual magnetic cells.

When the MTJ memory cell is in an array of memory cells connected to read/write circuitry, writing to the cell is accomplished by passing write currents through the top 50 and bottom 11, 13 electrode wiring layers (FIGS. 1A–1B) that serve as word lines (WL) and bit lines (BL) of the array. When a sufficiently large current is passed through both of these lines, the combined magnetic field that they generate in the vicinity of the free ferromagnetic layer 32 will cause the magnetization direction of the free ferromagnetic layer 32 to rotate from being parallel to antiparallel (or vice versa) to the magnetization direction of the pinned ferromagnetic layer 18. The current levels are selected so that the combined magnetic field they generate exceeds the switching field of the free ferromagnetic layer. The switching field of the free ferromagnetic layer will be determined by a number of factors, including the magnetic anisotropy of the free ferromagnetic layer, both intrinsic and that induced by growing the film in a magnetic field, and by the magnetostatic coupling of the free ferromagnetic layer to the fixed ferromagnetic layer. This field, generated by the combined write currents, is selected to be much smaller that the field required to rotate the magnetization of the pinned ferromagnetic layer. The write currents do not pass perpendicularly through the MTJ, which has a high resistance compared to the resistances of wiring layers 50 and 11, 13. The MTJ memory cell is read by passing a sense current perpendicularly through the MTJ from the pinned ferromagnetic layer through the tunnel junction barrier to the free ferromagnetic layer (or vice versa). The state of the memory cell is determined by measuring the resistance of the memory cell when a sense current, much smaller than the write currents, is passed perpendicularly through the MTJ. The self-field of this sense or read current is negligible and does not affect the magnetic state of the memory cell.

The probability of tunneling of charge carriers across the tunnel barrier depends on the relative alignment of the magnetic moments of the two ferromagnetic layers. The tunneling current is spin polarized, which means that the electrical current passing from one of the ferromagnetic layers is predominantly composed of electrons of one spin type (spin up or spin down, depending on the orientation of the magnetization of the ferromagnetic layer). The degree of spin polarization of the current is determined by the electronic properties of the magnetic material comprising the ferromagnetic layer at the interface of the ferromagnetic layer with the tunnel barrier. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged, neither parallel nor antiparallel, the tunneling probability takes an intermediate value. Thus, the electrical resistance of the MTJ memory cell depends on the spin polarization of the electrical current and the electronic properties of both of the ferromagnetic layers. As a result, the two possible magnetization directions of the free ferromagnetic layer uniquely define two possible bit states (0 or 1) of the memory cell.

Preferred Embodiments

The present invention is a MTJ memory cell with an in-stack ferromagnetic biasing layer to provide a transverse and/or longitudinal bias field to allow for reproducible magnetic states of the MTJ memory cell and to allow for coherent rotation of the magnetic moment of the free layer within the MTJ memory cell when the state of the cell is changed by the application of write fields.

Figure 2:
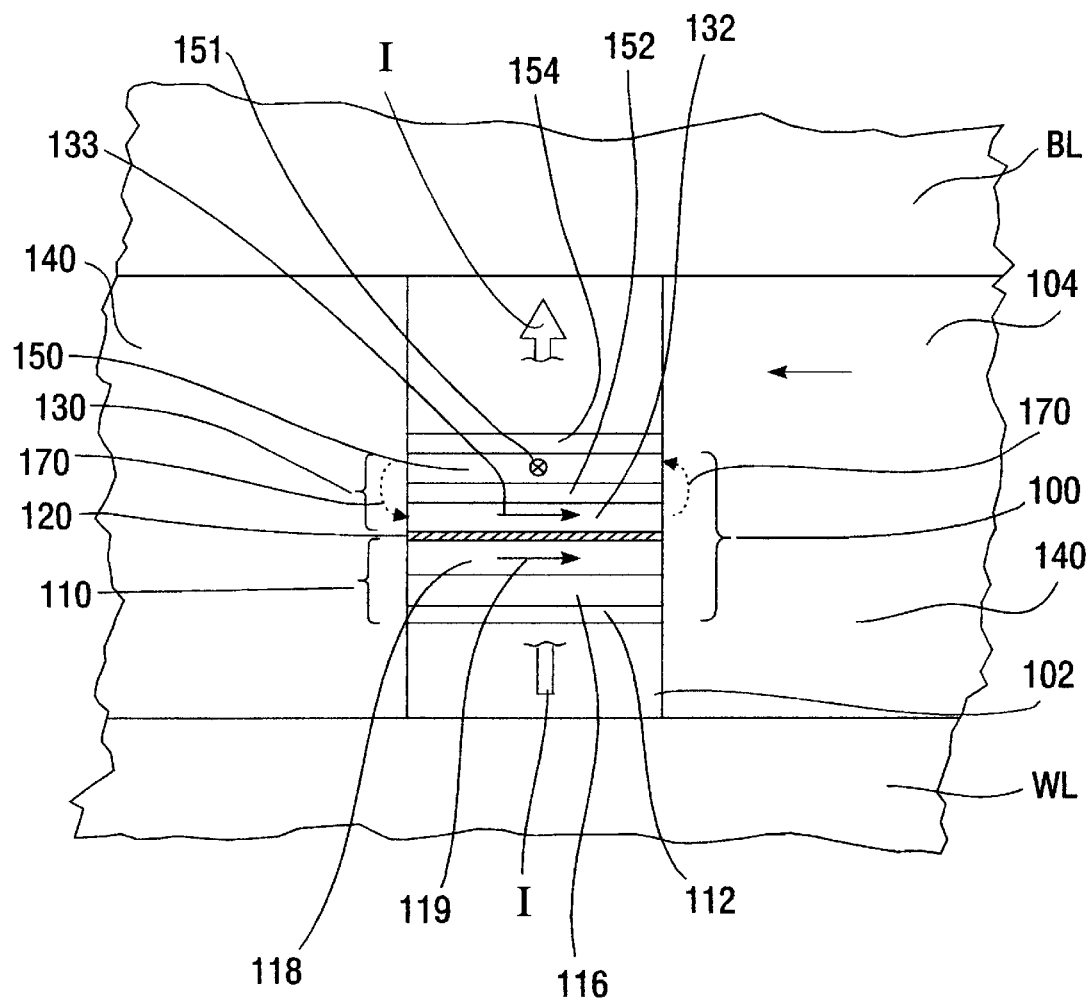
FIG. 2 is a cross-sectional view of one embodiment of a MTJ memory cell according to the present invention.

Referring first to FIG. 2, the MTJ memory cell includes a bottom electrical lead 102 formed on the word line WL corresponding to this particular memory cell within an array of memory cells, a top electrical lead 104 below the corresponding bit line BL for this particular memory cell, and the MTJ 100 formed as a stack of layers between top and bottom electrical leads 102, 104 and surrounded by insulating alumina layer 140. The electrical leads 102 and 104 are not required if the MTJ 100 is connected directly to WL and BL.

The MTJ 100 includes a first electrode multilayer stack 110, an insulating tunnel barrier layer 120, and a top electrode stack 130. Each of the electrodes 110, 130 includes a ferromagnetic layer in direct contact with tunnel barrier layer 120, i.e., ferromagnetic layers 118 and 132, respectively.

The base electrode layer stack 110 formed on electrical lead 102 includes a seed or "template" layer 112 on the lead 102, a layer of antiferromagnetic material 116 on the template layer 112, and a "fixed" ferromagnetic layer 118 formed on and exchange coupled with the underlying antiferromagnetic layer 116. The ferromagnetic layer 118 is called the fixed layer because its magnetic moment or magnetization direction (shown by arrow 119) is prevented from rotation in the presence of applied magnetic fields in the desired range of interest. The top electrode stack 130 includes a "sensing" or free ferromagnetic layer 132. The free ferromagnetic layer 132 is not exchange coupled to an antiferromagnetic layer, and its magnetization direction is thus free to rotate in the presence of applied magnetic fields in the range of interest. The free ferromagnetic layer 132 is fabricated so as to have its magnetic moment or magnetization direction (shown by arrow 133) oriented generally parallel or antiparallel to the direction 119 of the magnetic moment of the fixed ferromagnetic layer 118 in the absence of an applied magnetic field. The fixed ferromagnetic layer 118 in electrode stack 110 just beneath the tunnel barrier layer 120 has its magnetization direction fixed by interfacial exchange coupling with the immediately underlying antiferromagnetic layer 116, which also forms part of bottom electrode stack 110.

Also shown in FIG. 2 as part of top electrode stack 130 is a transverse biasing ferromagnetic layer 150 to provide a transverse bias field for stabilizing the magnetic state of the free ferromagnetic layer 132, and an electrically conductive nonferromagnetic spacer layer 152 separating and isolating the biasing layer 150 from the free layer 132 and the other layers of the MTJ 100. Finally there is a protective or capping layer 154 formed on top on the biasing layer 150. In one embodiment the biasing ferromagnetic layer 150 is a "hard" (relatively high coercivity) magnetic material, such as a binary alloy of Co and Pt or a ternary CoPtX alloy where X may be, for example, Cr or Ni, that has its magnetic moment (shown by arrow 151) aligned generally orthogonal to the magnetic moment 133 of the free ferromagnetic layer 132 in the absence of an applied magnetic field. The spacer layer 152, which is preferably Cr or a Cr—V alloy, has a thickness sufficient to prevent direct ferromagnetic coupling between the biasing ferromagnetic layer 150 and the free ferromagnetic layer 132, but is still thin enough to permit magnetostatic coupling (shown by dashed arrow 170) with the free ferromagnetic layer 132. The minimum thickness for the spacer layer 152 is approximately 2 nm. In addition to Cr or Cr—V, other materials that will function as the electrically conductive spacer layer are Ta, Cu, Pd, Pt, Rh, Ti and titanium nitride (TiN), depending on the material used for the biasing layer 150.

Figure 3A:
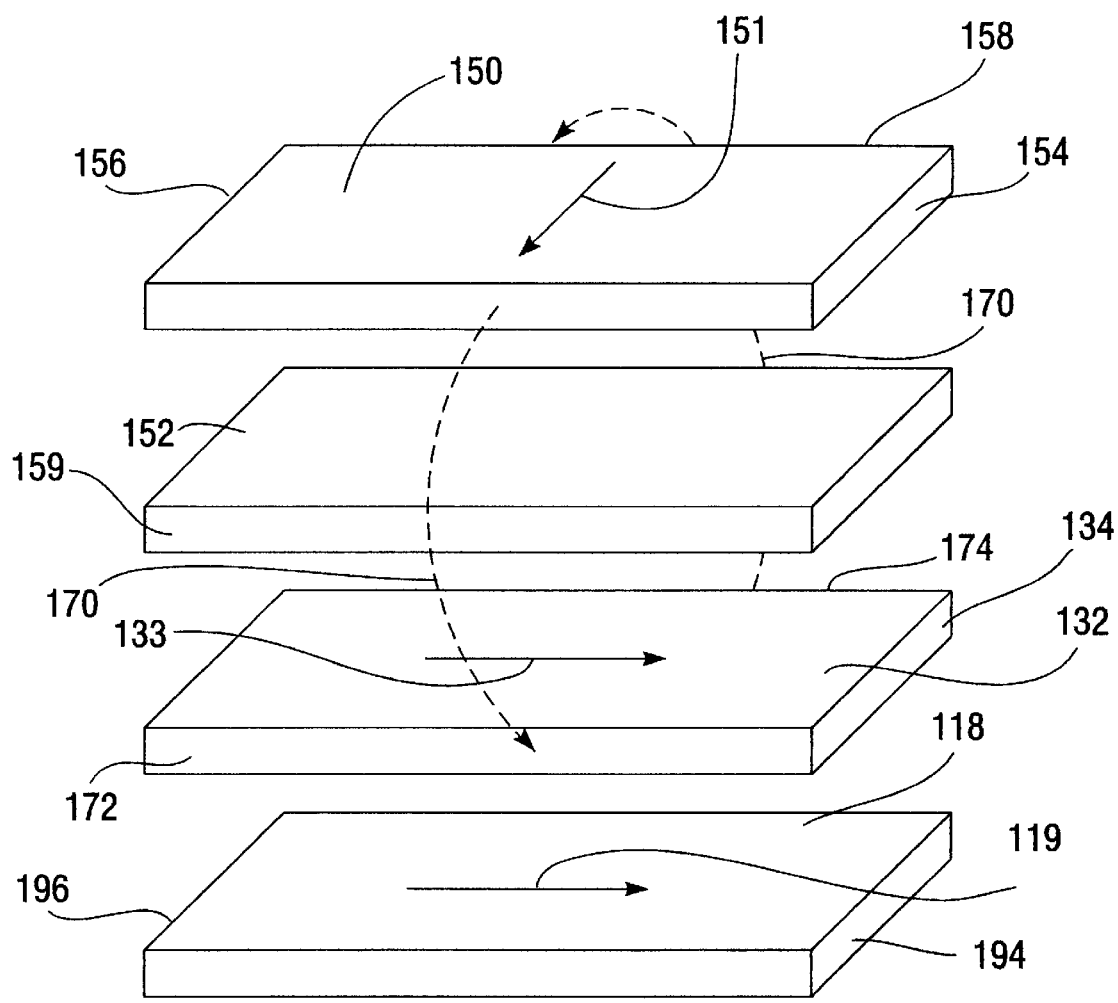
FIG. 3A and 3B are schematic illustrations of the magnetostatic coupling between the biasing ferromagnetic layer and the free ferromagnetic layer of the MTJ.

FIG. 3A illustrates the function of the self field or demagnetizing field from the biasing layer 150 when the moment (arrow 151) of the biasing layer 150 is set approximately orthogonal to the moments (133, 119) of the free and fixed ferromagnetic layers (132, 118), respectively. The arrows 170 indicate the magnetostatic coupling between the edges 158, 159 of the biasing layer 150 and the edges 172, 174 of the free layer 132. The operation of the MTJ memory cell requires that the free ferromagnetic layer 132 have its magnetic moment 133 aligned either parallel or antiparallel to the moment 119 of the fixed ferromagnetic layer 118 in the absence of an applied magnetic field. By setting the magnetic moment of the biasing layer 150 to be perpendicular to the magnetic moments of the free 132 and fixed 118 ferromagnetic layers the self field from the biasing layer 150 will provide a transverse bias field at the edges 172, 174 of the free layer 132.

The presence of the transverse bias field from the biasing ferromagnetic layer 150 ensures that the moment of the free layer 132 will rotate in only one direction when a magnetic field is applied to the MTJ memory cell by passing pulses of current along the WL and BL (FIG. 2). In addition, the transverse bias field reduces the applied field required to switch the state of the MTJ memory cell from "0" to "1" and vice versa. The magnitude of the transverse bias field can be readily varied to allow for optimum switching of the state of the MTJ memory cell by varying the moment of the biasing layer 150.

It is very important that the two states of the MTJ memory cell be equally stable with regard to positive and negative magnetic fields, i.e., that the magnetic hysteresis loop corresponding to the magnetic moment of the free layer be symmetrically disposed with regard to zero field. This will ensure that the magnetic field required to change the state of the memory cell from a "1" to a "0" be the same as the field required to change the state from a "0" to "1". The bit values "0" and "1" represent the two states of the MTJ memory cell where the moments of the free 132 and fixed 118 layers are either parallel or antiparallel to one another.

Figure 3B:
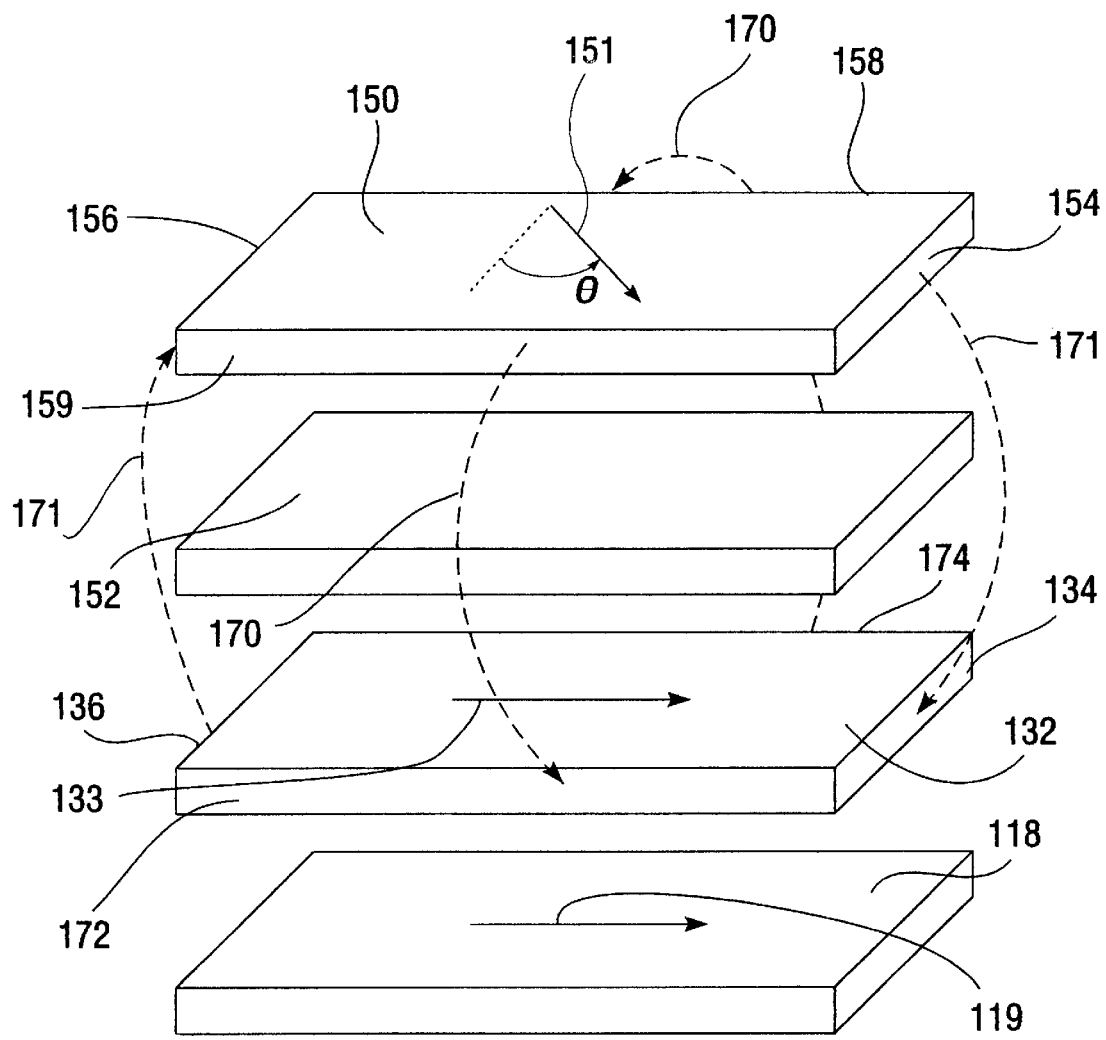

Typically the magnetic moments of the free layer 132 and the fixed layer 118 are magnetically coupled to one another via a number of mechanisms. These include the possibility of a ferromagnetic coupling field, $H_F$, which may result from roughness of the surfaces of the ferromagnetic layers, and an antiferromagnetic coupling field, $H_D$, which results from magnetostatic coupling between the edges 134, 136 of the free ferromagnetic layer 132 and the edges 194, 196 of the fixed ferromagnetic layer 118. It is important to balance these coupling fields so that the sum of the coupling fields in the absence of any sense field is approximately zero. In the MTJ memory cell of the present invention the biasing layer 150 can be used to provide a longitudinal bias field which can be used to balance the coupling fields, $H_F$ and $H_D$. As shown in FIG. 3B, in order to provide a longitudinal bias field the magnetic moment 151 of the biasing layer 150 is set not exactly orthogonal to the moments of the free 132 and fixed 118 ferromagnetic layers but at an angle θ away from this orthogonal or transverse direction, so that the moment 151 has both a transverse component and a longitudinal component. By increasing the angle θ from zero degrees (FIG. 3A) the relative magnitude of the longitudinal field compared to the transverse field can be increased.

Note that in FIG. 3B if θ~90° the moment of the biasing layer 150 is set in a direction approximately parallel to the direction 119 of the moment of the fixed layer 118. Thus the biasing layer 150 will provide a longitudinal magnetostatic coupling field (indicated by arrows 171) on the free layer 132 which is approximately in the opposite direction to any ferromagnetic coupling field between the fixed layer 118 and the free layer 132. By setting the direction of the moment of the biasing layer 150 in exactly the opposite direction (θ~–90°) the biasing layer 150 will provide a longitudinal magnetostatic coupling field at the free layer 132 which is along a direction approximately parallel to that of the ferromagnetic coupling field between the fixed layer 118 and the free layer 132 so that the longitudinal bias field would then be additive to $H_F$. Thus by varying the angle θ at which the moment of the biasing layer is set the longitudinal bias field component provided by the biasing layer can be used to offset the sum of $H_F$ and $H_D$ so that the magnetic hysteresis loop of the moment of the free layer 132 is centered approximately about zero applied magnetic field.

Generally the moment of the biasing layer 150 can be set in any direction θ between 0 and 360 degrees in the plane of the film 150. In FIG. 3A θ is ~0° so that the biasing layer 150 provides a substantially transverse field at the free layer 132, whereas in FIG. 3B θ is set at an intermediate angle, i.e., neither approximately orthogonal nor approximately parallel to the moment of the fixed and free layers so that the biasing layer 150 provides a combination of transverse and longitudinal bias fields at the free layer 132.

The magnitude of the bias field provided by the biasing layer 150 is determined by the product M*t where M is the magnetic moment per unit area of the material in the ferromagnetic layer and t is the thickness of the ferromagnetic layer.

Referring again to FIG. 2, the state of the MTJ memory cell is read by directing a sense current I from the WL to the first electrical lead 102 perpendicularly through the antiferromagnetic layer 116, the fixed ferromagnetic layer 118, the tunnel barrier layer 120, the free ferromagnetic layer 132, the electrically conductive spacer layer 152, the biasing ferromagnetic layer 150 and then out through the second electrical lead 104 to the BL. As described previously, the amount of tunneling current through the tunnel barrier layer 120 is a function of the relative orientations of the magnetizations of the fixed and free ferromagnetic layers 118, 132 that are adjacent to and in contact with the tunnel barrier layer 120. Thus the state of the MTJ memory cell, whether the moment of the free layer 132 is parallel or antiparallel to that of the moment of the fixed layer 118, can be determined by the amount of tunneling current which passes through the MTJ memory cell, which is reflected as a change in electrical conductance (or resistance) of the MTJ stack. This change in conductance is detected by the memory support electronics.

The spacer layer 152 (FIG. 3A) separates the two ferromagnetic layers 132, 150 from one another, while at the same time permitting magnetostatic coupling between the edges of the biasing ferromagnetic layer 150 and the free ferromagnetic layer 132. The magnetostatic coupling field between the edges 158, 159 of the biasing layer 150 and the edges 172,174 of the free layer 132 is used to maintain a generally single magnetic domain state in the free layer 132 when the moment of the free layer is changed from one state to the other state. In FIG. 3B the magnetostatic coupling field (arrows 171) between the edges 154,156 of the biasing layer 150 and the edges 134,136 of the free layer 132 is used to enable symmetric magnetic states of the free layer 132.

A representative set of materials for MTJ 100 (FIG. 2) will now be described. All of the layers of the MTJ 100 are grown in the presence of a magnetic field applied parallel to the surface of the substrate. The magnetic field serves to orient the easy axis of all of the ferromagnetic layers. In a conventional manufacturing apparatus the magnetic field can be rotated to the desired direction. A 5 nm Ta seed layer (not shown) is first formed on a 10–50 nm Au layer that serves as the bottom electrical lead 102. Cu or Al could also be used as the lead material. The seed layer is comprised of a material which encourages the (111) growth of the face-centered cubic (fcc) $Ni_{81}Fe_{19}$ template layer 112. The template ferromagnetic layer 112 encourages the growth of the antiferromagnetic layer 116. Suitable seed layer materials include fcc metals, such as Pt, Pd or Cu, as well as Ta or a combination of layers, such as 3–5 nm Ta/3–20 nm Pt, or Ti and Pd, such as 3–5 nm Ti/3–20 nm Pd. The MTJ base electrode stack 110 comprises a stack of 4 nm $Ni_{81}Fe_{19}$/10 nm $Mn_{50}Fe_{50}$/8 nm $Ni_{81}Fe_{19}$ (layers 112,116,118, respectively) grown on the Ta seed layer on the 10–20 nm Au layer 102. The Au layer 102 is formed on the word line WL which acts as the substrate. Next, the tunnel barrier layer 120 is formed by depositing and then plasma oxidizing a 0.8–2 nm Al layer. This creates the $Al_2O_3$ insulating tunnel barrier layer 120. The top electrode stack 130 is a 5 nm $Ni_{81}Fe_{19}$ free ferromagnetic layer 132, a 3 nm Cr spacer layer 152, a 10 nm $Co_{75}Pt_{13}Cr_{12}$ biasing ferromagnetic layer 150 and a 10 nm Ta capping layer 154. The Ta layer 154 serves as a protective capping layer. The top electrode stack 130 is contacted by a 20 nm Au layer that serves as the top electrical lead 104.

Note that since the current passes perpendicular to the layers in MTJ 100, the resistance of the MTJ cell will be largely dominated by that of the tunnel barrier layer 120. Thus, the resistance per unit area of the conductive leads 102, 104 can be much higher than in conventional MR read heads in which the current flows parallel to the layers. Thus, the leads 102, 104 can be made thinner and/or narrower than in conventional MR head structures, and/or can be made from intrinsically more resistive materials, such as alloys or combinations of elements.

It is important that the layers in the bottom electrode stack 110 be smooth, and that the $Al_2O_3$ tunnel barrier layer 120 be free of pinholes which would electrically short the junction. For example, growth by sputtering techniques known to produce good giant magnetoresistance effects in metallic multilayer stacks is sufficient. In the MTJ 100, the direction of the magnetic moments of the fixed and free ferromagnetic layers 118, 132, respectively, are approximately parallel to one another in zero applied magnetic field. The direction of the magnetic moment of the fixed layer 118 is largely determined by that of the exchange anisotropy field of the antiferromagnetic layer 116. The orientation of the magnetic moment of the free layer 132 is influenced by a number of factors, including the intrinsic anisotropy of the ferromagnetic layer itself and the shape of this layer. An intrinsic magnetic anisotropy can be induced in the free layer 132 by depositing it in a small magnetic field arranged to be parallel to that of the magnetization direction of the fixed layer 118. If the shape of the free layer 132 is not square, there may be a magnetic anisotropy resulting from the rectangular shape of the free layer. By choosing the length of the free layer to be longer than its width, the shape anisotropy will favor the magnetic moment of the free layer to be oriented parallel to that of the fixed layer 118. Thus, the intrinsic and shape anisotropies can be arranged to favor the proper orientation of the magnetic moment of the free layer parallel to that of the fixed layer. However, neither of these anisotropies is essential for the proper operation of the MTJ memory cell. Proper orientation of the magnetic moment of free layer 132 can be accomplished by the presence of the biasing layer 150 alone. The magnetostriction of the free layer 132 is arranged to be close to zero (by choice of composition of the Ni—Fe alloy) so that any stresses in this layer induced by the fabrication process do not, of themselves, lead to any magnetic anisotropy.

An alternative free ferromagnetic layer 132 may be comprised of a thin Co or $Co_{(100-x)}Fe_{(x)}$ or $Ni_{(100-x)}Fe_x$ (x is approximately 60) layer at the interface between the free ferromagnetic layer 132 and the tunnel barrier layer 120, with the bulk of layer 132 being a low magnetostriction material, such as $Ni_{(100-x)}Fe_x$ (x is approximately 19). The net magnetostriction of this type of free layer with a thin Co or $Co_{(100-x)}Fe_{(x)}$ or $Ni_{(100-x)}Fe_x$ (x is approximately 60) interface layer is arranged to have a value close to zero by slight variations of the composition of the bulk of layer 132. An alternative fixed ferromagnetic layer 118 may be comprised largely of a bulk $Ni_{(100-x)}Fe_{(x)}$ layer with a thin layer of a Co or $Co_{(100-x)}Fe_{(x)}$ or $Ni_{(100-x)}Fe_x$ (x is approximately 60) layer at the interface with the tunnel barrier layer 120. The largest signal is obtained with Co or with the highest polarization $Ni_{(100-x)}Fe_x$ (x is approximately 60) or $Co_{(100-x)}Fe_{(x)}$ alloy (x is approximately 70). The interface layer is optimally about 0.4–2 nm thick. The net magnetostriction of the combined layer is arranged to be close to zero by small variations of the composition. If the bulk of fixed layer 118 is Ni—Fe, then the composition is $Ni_{81}Fe_{19}$, the composition for which bulk Ni—Fe has zero magnetostriction.

The Fe—Mn antiferromagnetic layer 116 may be replaced with a layer of Ni—Mn, Ir—Mn, CrMnPd, CrMnPt or MnPtPd or other suitable antiferromagnetic layer which exchange biases the ferromagnetic material in the fixed layer 118 and which has a resistance which is substantially less than that of the $Al_2O_3$ barrier layer. Similarly, the stability of the fixed layer 118 can be increased further by forming it from a lamination of two ferromagnetic layers, such as Ni, Co, Ni—Fe alloys, Co—Fe alloys, or Ni—Fe—Co ternary alloys, separated by a thin metallic layer, which results in antiferromagnetic coupling of the two ferromagnetic layers. This type of laminated fixed layer is described in IBM's U.S. Pat. No. 5,465,185.

Figure 4:
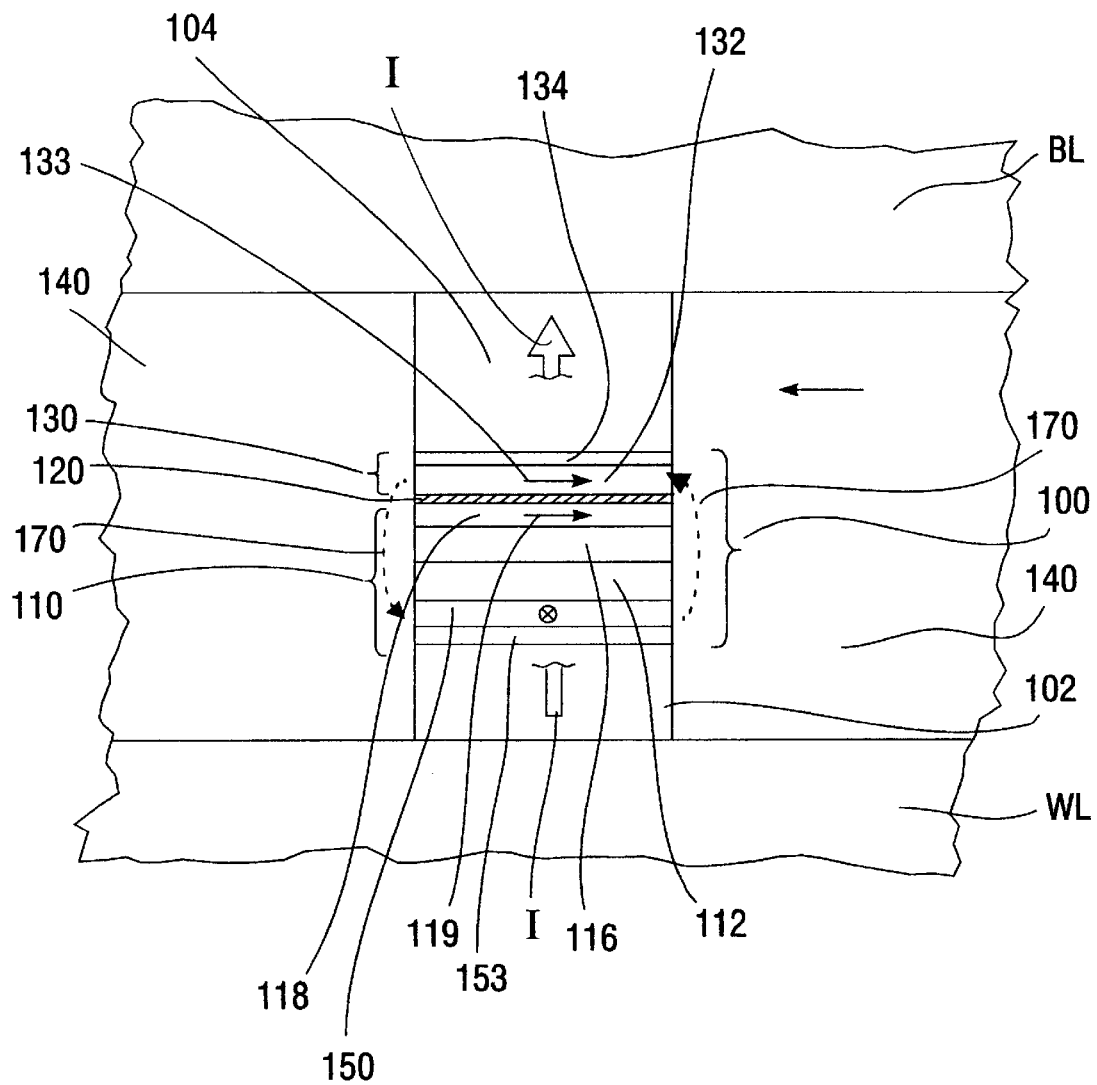
FIG. 4 is a cross-sectional view of another embodiment of a MTJ memory cell according to the present invention.

The MTJ memory cell can also be fabricated with the biasing ferromagnetic layer 150 located below the fixed ferromagnetic layer 118, as illustrated in FIG. 4. In this embodiment the biasing ferromagnetic layer 150 is formed on a seed layer 153 formed on the bottom lead 102. The seed layer 112 for the antiferromagnetic layer 116 is grown on top of the biasing layer 150. A separate spacer layer may be used, or the combination of the seed layer 112 and the antiferromagnetic layer 116 may together function as the electrically conductive spacer layer between the biasing layer 150 and the fixed ferromagnetic layer 118. The spacer layer (layers 112 and 116) isolates the biasing ferromagnetic layer 150 from the fixed ferromagnetic layer 118 to prevent direct ferromagnetic coupling between the two layers, which would occur if they were in contact or not sufficiently separated by a nonferromagnetic layer. In the embodiment of FIG. 4, the magnetostatic coupling (arrows 170) between the edges of the biasing ferromagnetic layer 150 and the free ferromagnetic layer 132 occurs across the seed layer 112, the antiferromagnetic layer 116, the fixed ferromagnetic layer 118 and the tunnel barrier layer 120. The moment (arrow 151) of the biasing layer 150 can be set in a direction largely orthogonal to the direction of the moments of the free and fixed layers (as shown in FIG. 4) to provide a transverse bias field to ensure a single magnetic domain state within the free layer 132, or can be set at any angle in the plane of the layer to provide a combination of transverse and longitudinal bias, as described above with respect to FIG. 3B.

The process for preparing the MTJ memory device according to the present invention of FIG. 2 will now be described. The material for electrical lead 102 and the individual layers making up MTJ 100 are deposited on WL as the substrate. Film growths are carried out by magnetron sputtering with argon (Ar) gas with the substrate at ambient temperature. Care must be taken to ensure that the sputter growth produces very smooth films. An applied magnetic field of magnitude 20–100 Oe, with the field direction in the plane of the substrate may be used to induce magnetic anisotropy into the ferromagnetic layers as they are grown. As part of the formation of the MTJ 100, the aluminum layer which is to become the tunnel barrier layer 120 is deposited and then subsequently plasma oxidized at an oxygen pressure of 100 mTorr and a power density of 25 W/cm² for 30–240 seconds. This forms the insulating tunnel barrier layer 120 of alumina. The plasma oxidation of the aluminum layer is done without breaking vacuum in the process.

Although not essential to the operation of the MTJ memory cell, it may be beneficial to induce in the fixed 118, free 132 and biasing 150 ferromagnetic layers appropriate magnetic anisotropies by depositing these layers in approximately orthogonal magnetic fields. The fixed and free ferromagnetic layers are grown in a field oriented along the directions 119 and 133. Prior to the deposition of the biasing ferromagnetic layer 150 in the MTJ 100 and after formation of the free ferromagnetic layer 132 and the alumina tunnel barrier layer 120, the magnet assembly that generates the external field is rotated by an angle of approximately 90 degrees if θ~0° or (90−θ) degrees if the biasing layer is to have its moment aligned at an intermediate angle θ to provide a combination of both transverse and longitudinal bias fields. Alternatively, the substrate can be rotated.

Figure 5:
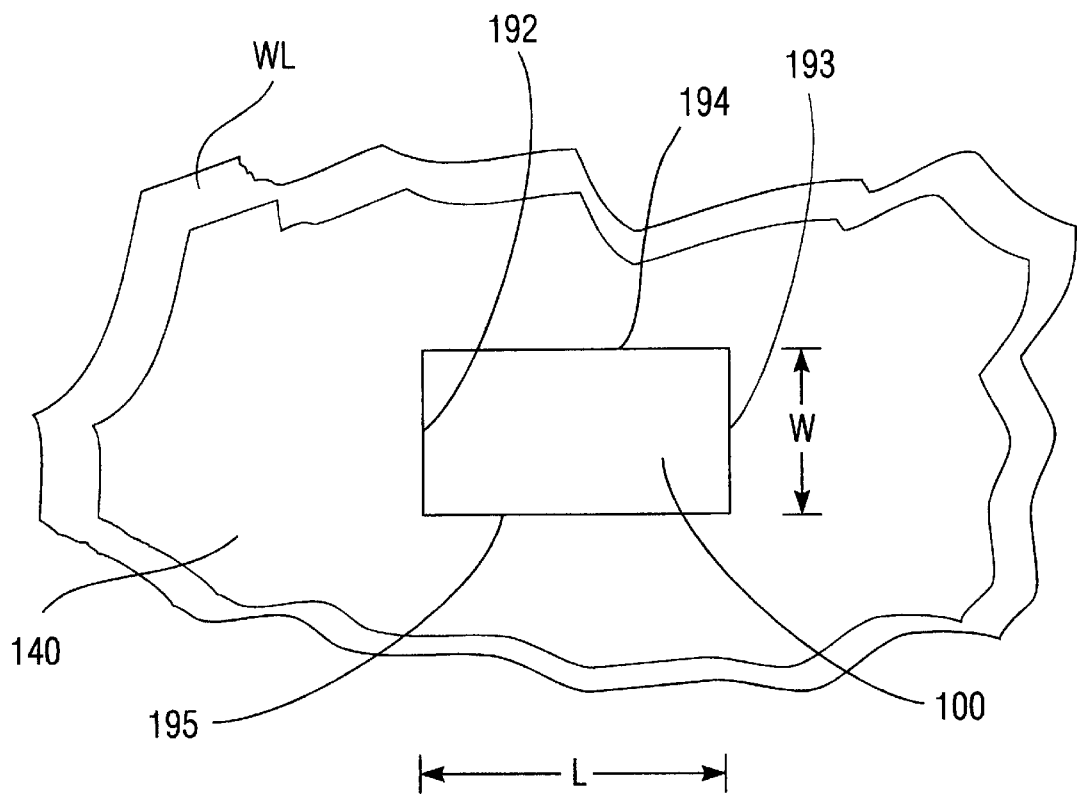
FIG. 5 is a top view of the MTJ memory cell of FIG. 2 illustrating the shape of the memory cell.

The layers making up MTJ 100 and electrical lead 102 are then patterned into the shape of the MTJ memory cell as illustrated in FIG. 5. A positive photoresist is applied to define the shape of the MTJ memory cell with a length L defined by edges 192 and 193 and a width W defined by edges 194 and 195. Material is then removed from MTJ 100 by ion milling down to the word line WL (which may be a via leading to the word line WL). Next, the alumina insulator layer 140 is deposited over the photoresist and the photoresist is removed, leaving alumina insulator layer everywhere except on the surface of MTJ 100 which is bounded by edges 192, 193, 194, 195. The fabrication of the MTJ memory cell is then essentially complete.

Alternatively, when fabricating the MTJ memory cell shape for very narrow geometries with W and L dimensions below approximately 1 micron, two photoresist shapes or masks can be used. One shape has a critical feature which corresponds only to the edges 192 and 193 but with very large width. The second shape has a critical feature which corresponds only to the edges 194 and 195 but with very large length. The subsequent process sequence is repeated twice. The first positive photoresist shape is applied, material is then removed from MTJ 100 by ion milling down to the WL and then alumina 140 is deposited over the photoresist and the photoresist is removed. The second positive photoresist shape is then applied, material is then removed from MTJ 100 by ion milling down to WL and then alumina 140 is deposited over the photoresist and the photoresist is removed.

In order to obtain symmetric states for the MTJ memory cell, it is important that in the absence of any applied fields the ferromagnetic coupling field $H_F$ between the free and fixed ferromagnetic layers be balanced with the demagnetization field $H_D$ from the fixed ferromagnetic layer. Since the tunneling current is flowing normal to the layers of the structure, little field is induced from current flow in the layers. $H_F$ depends critically on the nature of the interfaces between the ferromagnetic layers and the actual junction and the thickness of the junction. $H_F$ can vary from several Oersteds (Oe) to 20–50 Oe. $H_D$ depends on the geometry of the cell, i.e., the length L and the thickness t of the fixed ferromagnetic layer, and the fixed ferromagnetic magnetization M, and varies as $[4\pi \times (t/L) \times M]$. Thus, for t=50 Å, L=10,000 Å, M=800 emu/cm³, $H_D$ is in the 40 Oe range. By varying the geometry of the cell and the characteristics of the interfaces, $H_D$ can be approximately matched to $H_F$. One manner of balancing these two forces is to design a MTJ memory cell that minimizes both fields. $H_D$ can be minimized by using the laminated antiparallel pinned layer described in the previously-cited IBM U.S. Pat. No. 5,465, 185. The net magnetic moment of such a layer is equivalent to the difference between the two pinned films, this difference being approximately 5 Å, so that $H_D$ is reduced to approximately 4 Oe. One can then optimize the interface to reduce $H_F$. In the present invention by setting the moment of the biasing layer 150 at an angle θ the magnetostatic coupling of biasing layer 150 to the free layer 132 provides a longitudinal bias field. This longitudinal bias field can be varied by varying the angle θ at which the moment of biasing layer 150 is set so as to match the sum of $H_D$ and $H_F$ so that there is no net longitudinal field on the free layer 132.

After the MTJ memory cell is connected to the BL and the structure is essentially complete, it is still necessary to align the magnetization of the fixed ferromagnetic layer 118 in the proper direction. The Fe—Mn layer 116 for exchange coupling with the fixed ferromagnetic layer 118 is antiferromagnetic as deposited. However, its magnetization must be realigned so that it can exchange couple the fixed ferromagnetic layer 118 in the proper orientation. The structure is placed in an annealing oven and the temperature is raised to approximately 180° C., which is greater than the blocking temperature of Fe—Mn. At this temperature, the Fe—Mn layer no longer gives rise to an exchange anisotropy with the fixed ferromagnetic layer 118. An exchange anisotropy of the ferromagnetic layer 118 is developed by cooling the pair of layers 116, 118 in a magnetic field. The orientation of the magnetization of the fixed ferromagnetic layer 118 will be along the direction of the magnetic field applied during cooling. The applied magnetic field in the annealing oven thus causes the moment of the fixed ferromagnetic layer 118 to be fixed along the required direction, as shown by arrow 119 in FIG. 2. This is a result of cooling the Fe—Mn layer in the presence of the ferromagnetic layer 118, magnetized by the applied magnetic field, in the required direction. Thus, at temperatures below the blocking temperature of Fe—Mn, in the presence of an applied magnetic field from the recorded medium, the magnetic moment of the fixed ferromagnetic layer 118 will not substantially rotate. Next, a magnetic field sufficient to fully magnetize the biasing ferromagnetic layer 150 is applied, preferably at room temperature, along a direction at an angle θ. Thus, on reducing the applied magnetic field to approximately zero the magnetic moment of the biasing ferromagnetic layer 150 will be fixed along a direction θ.

In addition to using a single layer of high coercivity material, such as CoPtCr, as the biasing ferromagnetic layer, there are two other structures that will serve as the biasing ferromagnetic layer. First, the biasing ferromagnetic layer may be a bilayer formed from a first ferromagnetic film of a lower coercivity material, such as 5 nm of Ni—Fe, and a second ferromagnetic film of a higher coercivity material, such as 10 nm of CoPtCr. The net coercivity of the bilayer will be between the coercivity of the two films making up the bilayer. Because the first film will have a higher moment per unit area than the second film, for the same thickness as a single layer of CoPtCr, the bilayer will have a higher M*t. This is an advantage when it is desired to minimize the total thickness of layers between the write and bit lines WL, BL but still provide the value of M*t required to stabilize the free ferromagnetic layer.

Second, the biasing ferromagnetic layer may be a ferromagnetic film and an antiferromagnetic film in contact with and interfacially exchange coupled with the first ferromagnetic film. The antiferromagnetic film secures the magnetic moment of the first ferromagnetic film in the chosen direction θ in the absence of an applied magnetic field. The ferromagnetic film may be Ni—Fe and the antiferromagnetic film may be Ni—Mn. In this embodiment the antiferromagnetic film must be made of a material that has a blocking temperature sufficiently distinct from the blocking temperature of the material used for the antiferromagnetic layer 116. Ni—Mn has a blocking temperature of up to approximately 450° C. and Fe—Mn has a blocking temperature of approximately 200° C. Thus the exchange bias field provided by the antiferromagnetic layer with the higher blocking temperature is set first by heating the device to a temperature above this blocking temperature and cooling in a magnetic field oriented along the direction of the whichever ferromagnetic layer (either 150 or 118) is exchange coupled to the antiferromagnetic layer with the higher blocking temperature. Then, in a second step, after cooling to a temperature slightly greater than the blocking temperature of the lower antiferromagnetic layer, the magnetic field orientation (or alternatively the substrate orientation) is rotated and the structure is further cooled.

Note that if the biasing layer 150 is comprised of an exchange biased layer formed, for example, from a bilayer of a ferromagnetic layer of permalloy covered with an antiferromagnetic layer of FeMn then the most suitable spacer layer 152 is comprised of Ta, or alternatively a nonferromagnetic Ni—Fe—Cr alloy layer. A suitable Ni—Fe—Cr alloy is one for which there is sufficient Cr that the alloy is nonferromagnetic over the operating temperature range of the MTJ cell. The spacer layer 152 (FIG. 2), or the seed layer 153 (FIG. 4), must be comprised of a material suitable for forming the exchange biased layer 150.

The MTJ memory cell of the present invention with the in-stack biasing ferromagnetic layer is also capable of use where the fixed ferromagnetic layer 118 has its magnetic moment fixed by a technique other than interfacial exchange coupling with the antiferromagnetic layer 116. In this embodiment, the fixed ferromagnetic layer is comprised of a ferromagnetic material which has the property of high coercivity such that, in the presence of applied magnetic fields in the range of interest, the magnetic moment of this layer is essentially fixed or pinned by its intrinsic magnetic anisotropy. A suitable ferromagnetic material would be an alloy of Co and one or more other elements, such as a CoPtCr ternary alloy (e.g., $Co_{75}Pt_{12}Cr_{13}$) or a CoPtNi ternary alloy or a CoCrTa ternary alloy or a CoPt binary alloy. The magnetic properties of this hard or high coercivity fixed ferromagnetic layer may be affected by the seed layer on which it is grown. For example, a suitable seed layer for CoPtCr would be a layer of Cr. In this embodiment, if the biasing ferromagnetic layer 150 is also comprised of a high coercivity ferromagnetic layer then the coercivity of the biasing ferromagnetic layer 150 and the fixed ferromagnetic layer 118 must be sufficiently different that the magnetic moments of these layers can be set by applying magnetic fields of different magnitudes along the required respective directions 151 and 119 with the moment of the higher coercivity material being set first.

While the MTJ memory cell described and shown in FIGS. 2 and 4 has the fixed ferromagnetic layer on the bottom of MTJ 100, the device can also be formed by depositing the free ferromagnetic layer first, followed by the tunnel barrier layer, the fixed ferromagnetic layer, and the antiferromagnetic layer. Such a MTJ memory cell would then have the layers essentially inverted from the MTJ 100 shown in FIGS. 2 and 4.

Figure 6:
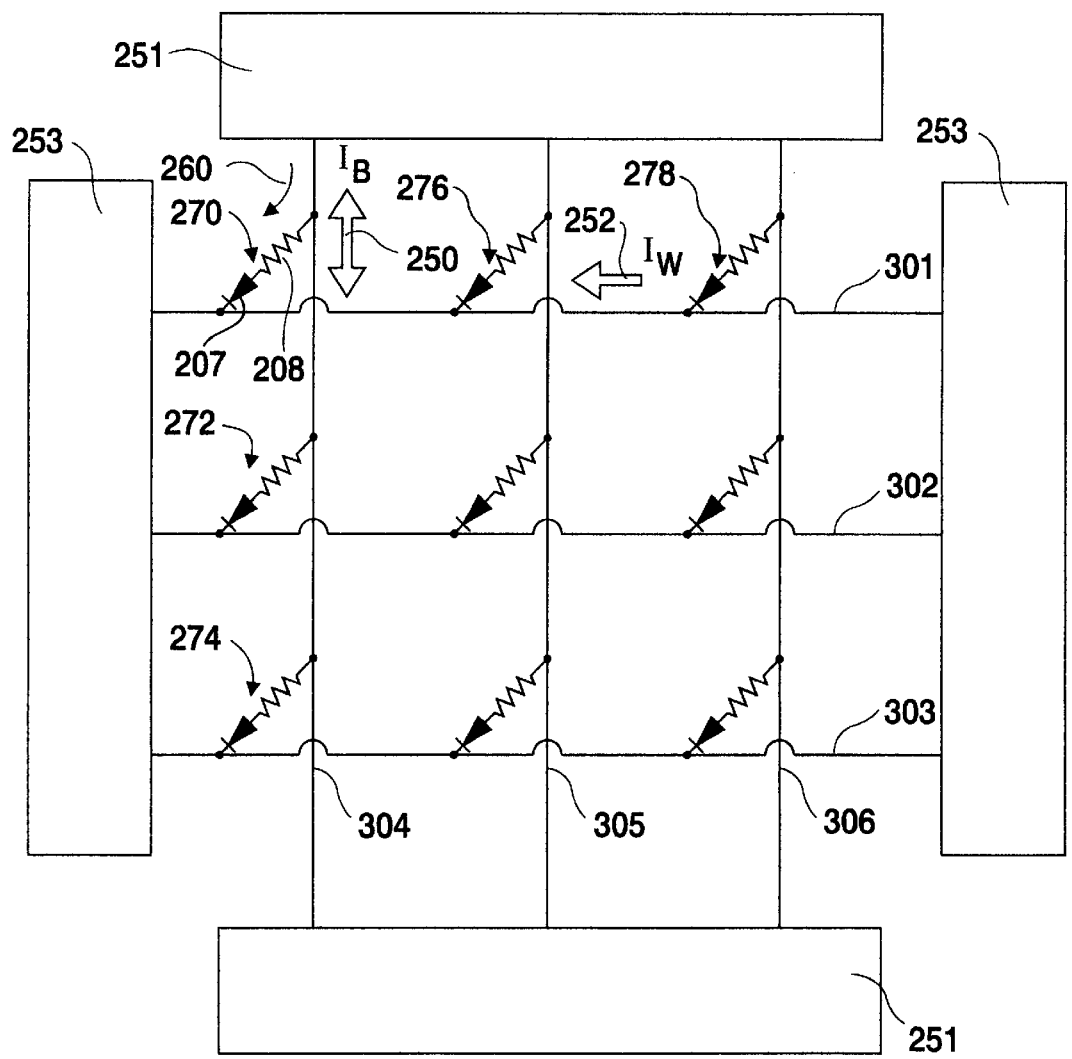
FIG. 6 is a schematic of a prior art magnetic memory array usable with MTJ memory cells according to the present invention for illustrating the read and write operations to the individual cells.

Referring now to FIG. 6, the method of writing to MTJ memory cells in an array will be described. This method and the MRAM architecture are described in more detail in IBM's previously-cited '343 patent. The array includes a set of electrically conductive parallel word lines 301, 302, and 303 in a horizontal plane, and a set of electrically conductive parallel bit lines 304, 305, and 306 in another horizontal plane. The bit lines are oriented in a different direction, preferably at right angles to the word lines, so that the two sets of lines intersect when viewed from above. MTJ memory cells, such as typical memory cells 270, 272, 274, 276, 278, are located at each crossing point of the word lines and bit lines in the intersection region spaced between the lines. During operation of the array, sense current for reading the state of the individual cells flows in a vertical direction through the cell. The array is formed on a substrate, such as a silicon substrate on which the read/write circuitry, such as word line control circuitry 253 and bit line control circuitry 251, is also formed. As shown in FIG. 6, a selected MTJ memory cell 270 (shown schematically as a resistor 208 in series with a diode 207) is written by passing current $I_B$, shown by arrow 250, through bit line 304 and current $I_W$, shown by arrow 252, through word line 301. Bit line control circuitry 251 is attached to the bit lines (304, 305, 306) and controls $I_B$. Word line control circuitry 253 is attached to the word lines (301, 302, 303) and controls $I_W$. The magnetic field produced by either $I_B$ or $I_W$ alone in the region of the cells is less than the magnetic field required to change the magnetic state in a cell, so half-selected cells 272, 274, 276, 278 (those over or under which only $I_B$ or $I_B$ alone is passing) are not written. However, the combination of magnetic fields from $I_B$ and $I_W$ is sufficient to change the state of selected memory cell 270. At least one of the currents $I_B$ or $I_W$ has to be reversible to write the two different magnetic states of the cell 270. The bit lines 304, 305, 306 are chosen to have bidirectional currents and also to be connected to the sensing circuitry, which is part of bit line control circuitry 251, so only the bit line control circuitry has to connect to an external data path. The external data path is advantageously connected to only one edge of a memory array to avoid the wire length needed to reach a second edge. The array shown in FIG. 6 has only one selected cell 270, but any cell along the word line 301 could be the selected cell, or multiple cells along the word line could be selected by energizing more than one bit line.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction memory cell having two magnetic states and usable in a nonvolatile magnetic memory array of memory cells, the array being connected to read/write circuitry for altering and detecting the magnetic state of individual memory cells in the array, the memory cell comprising:

a first electrically conductive lead;

a magnetic tunnel junction stack formed on the first lead and comprising a fixed ferromagnetic layer having its magnetic moment fixed in a preferred direction in the presence of an applied magnetic field caused by current from the read/write circuitry, an insulating tunnel barrier layer in contact with the fixed ferromagnetic layer, a free ferromagnetic layer in contact with the insulating tunnel barrier layer and whose magnetic moment is free to rotate between directions generally parallel and antiparallel to the magnetic moment of the fixed ferromagnetic layer when exposed to an applied magnetic field caused by current from the read/write circuitry, and a biasing ferromagnetic layer for biasing the magnetic moment of the free ferromagnetic layer in a preferred direction in the absence of an applied magnetic field; and a second electrically conductive lead formed on and in contact with the magnetic tunnel junction stack; whereby when the electrical leads are connected to the read/write circuitry, the electrical resistance to current flow through the insulating tunnel barrier layer in a direction generally perpendicular to the fixed and free ferromagnetic layers is determined by said parallel or antiparallel magnetic moment of said free ferromagnetic layer, the value of said electrical resistance thereby allowing the magnetic state of the memory cell to be determined.

2. The memory cell according to claim 1 wherein the magnetic moment of the biasing ferromagnetic layer is substantially orthogonal to the magnetic moment of the fixed ferromagnetic layer for providing a transverse bias field to the free ferromagnetic layer.

3. The memory cell according to claim 1 wherein the magnetic moment of the biasing ferromagnetic layer is substantially parallel or antiparallel to the magnetic moment of the free ferromagnetic layer in the absence of an applied magnetic field for providing a longitudinal bias field to the free ferromagnetic layer.

4. The memory cell according to claim 1 wherein the biasing ferromagnetic layer has a magnetic moment within its plane that is oriented between greater than −90 degrees and less than +90 degrees, where 0 degrees corresponds to a transverse direction generally orthogonal to the moment of the fixed ferromagnetic layer and +90 degrees corresponds to a longitudinal direction generally parallel to the moment of the fixed ferromagnetic layer, whereby the biasing ferromagnetic layer provides both transverse and longitudinal bias fields to the free ferromagnetic layer.

5. The memory cell according to claim 1 wherein the first electrical lead is the bottom lead, the magnetic tunnel junction stack is formed on the substrate such that the fixed ferromagnetic layer is in electrical connection with the first electrical lead, and the second electrical lead is the top lead and is in electrical contact with the free ferromagnetic layer.

6. The memory cell according to claim 5 further comprising an electrically conductive nonferromagnetic spacer layer formed on top of the free ferromagnetic layer and wherein the biasing ferromagnetic layer is formed on top of the nonferromagnetic spacer layer, whereby the biasing ferromagnetic layer and the free ferromagnetic layer are separated from contact with one another.

7. The memory cell according to claim 5 wherein the biasing ferromagnetic layer is formed between the bottom lead and the fixed ferromagnetic layer and further comprising an antiferromagnetic layer between the biasing ferromagnetic layer and the fixed ferromagnetic layer and in contact with the fixed ferromagnetic layer for fixing the magnetic moment of the fixed ferromagnetic layer in said preferred direction by interfacial exchange coupling, the antiferromagnetic layer further being electrically conductive and separating the biasing ferromagnetic layer and the free ferromagnetic layer from contact with one another.

8. The memory cell according to claim 1 wherein the biasing ferromagnetic layer is formed on top of the first lead and further comprising an electrically conductive nonferromagnetic spacer layer formed on top of the biasing ferromagnetic layer, and wherein the fixed ferromagnetic layer is formed on top of the nonferromagnetic spacer layer, whereby the biasing ferromagnetic layer and the fixed ferromagnetic layer are separated from contact with one another.

9. The memory cell according to claim 1 wherein the first electrical lead is the bottom lead, the free ferromagnetic layer is in electrical connection with the first electrical lead, and the second electrical lead is the top lead and is in electrical contact with the fixed ferromagnetic layer.

10. The memory cell according to claim 1 wherein the magnetic tunnel junction stack further comprises an antiferromagnetic layer in contact with the fixed ferromagnetic layer for fixing the magnetic moment of the fixed ferromagnetic layer in said preferred direction by interfacial exchange coupling.

11. The memory cell according to claim 1 further comprising an electrically conductive nonferromagnetic spacer layer separating the biasing ferromagnetic layer from contact with the free ferromagnetic layer and the fixed ferromagnetic layer.

12. The memory cell according to claim 1 wherein the biasing ferromagnetic layer comprises a single layer having a magnetic moment approximately equal to or greater than the magnetic moment of the free ferromagnetic layer.

13. The memory cell according to claim 12 wherein the single biasing ferromagnetic layer is formed of an alloy comprising Co, Pt and Cr.

14. The memory cell according to claim 1 wherein the biasing ferromagnetic layer comprises a bilayer of a first ferromagnetic film and a second ferromagnetic film having a coercivity higher than the coercivity of the first ferromagnetic film.

15. The memory cell according to claim 14 wherein the first ferromagnetic film comprises an alloy of Ni and Fe, and wherein the second ferromagnetic film comprises an alloy of Co, Pt and Cr.

16. The memory cell according to claim 1 wherein the biasing ferromagnetic layer comprises a ferromagnetic film and an antiferromagnetic film in contact with and interfacially exchange coupled with the first ferromagnetic film.

17. The memory cell according to claim 16 wherein the ferromagnetic film comprises an alloy of Ni and Fe, and wherein the antiferromagnetic film comprises an alloy of Ni and Mn.

18. The memory cell according to claim 1 wherein the electrical leads comprise a word line and a bit line for connection to read/write circuitry.

19. A magnetic tunnel junction memory cell having two magnetic states and usable in a nonvolatile magnetic memory array of memory cells, the array being connected to read/write circuitry for altering and detecting the magnetic state of individual memory cells in the array, the memory cell comprising:

a substrate;

a bottom electrically conductive write line formed on the substrate;

a fixed ferromagnetic layer formed over and electrically connected to the bottom write line, the magnetization direction of the fixed ferromagnetic layer being fixed in a preferred direction in the presence of an applied magnetic field caused by current from the read/write circuitry;

an insulating tunneling barrier layer located on and in contact with the fixed ferromagnetic layer;

a free ferromagnetic layer located on and in contact with the tunneling barrier layer and whose magnetization is oriented in a direction generally parallel or antiparallel to the magnetization direction of the fixed ferromagnetic layer in the absence of an applied magnetic field and whose magnetization direction is free to rotate between directions generally parallel and antiparallel to the magnetization direction of the fixed ferromagnetic layer when exposed to an applied magnetic field caused by current from the read/write circuitry;

a biasing ferromagnetic layer having a magnetization direction within its plane that is oriented between greater than −90 degrees and less than +90 degrees, where 0 degrees corresponds to a transverse direction generally orthogonal to the magnetization direction of the fixed ferromagnetic layer and +90 degrees corresponds to a longitudinal direction generally parallel to the magnetization direction of the fixed ferromagnetic layer, whereby the biasing ferromagnetic layer may provide transverse or longitudinal bias fields, or both transverse and longitudinal bias fields, to the free ferromagnetic layer, depending on said orientation of the biasing ferromagnetic layer's magnetization direction;

an electrically conductive nonferromagnetic spacer layer located between the biasing ferromagnetic layer and the fixed ferromagnetic layer; and a top electrically conductive write line electrically connected to the free ferromagnetic layer, whereby when the write lines are connected to the read/write circuitry, the electrical resistance to current flow through the insulating tunnel barrier layer in a direction generally perpendicular to the fixed and free ferromagnetic layers is determined by said parallel or antiparallel magnetization direction of said free ferromagnetic layer, the value of said electrical resistance thereby allowing the magnetic state of the memory cell to be determined.

20. The memory cell according to claim 19 further comprising an antiferromagnetic layer in contact with the fixed ferromagnetic layer for fixing the magnetization direction of the fixed ferromagnetic layer in said preferred direction by interfacial exchange coupling.

21. The memory cell according to claim 19 wherein the biasing ferromagnetic layer comprises a single layer having a magnetic moment approximately equal to or greater than the magnetic moment of the free ferromagnetic layer.

22. The memory cell according to claim 21 wherein the single biasing ferromagnetic layer is formed of an alloy comprising Co, Pt and Cr.

23. The memory cell according to claim 19 wherein the biasing ferromagnetic layer comprises a bilayer of a first ferromagnetic film and a second ferromagnetic film having a coercivity higher than the coercivity of the first ferromagnetic film.

24. The memory cell according to claim 23 wherein the first ferromagnetic film comprises an alloy of Ni and Fe, and wherein the second ferromagnetic film comprises an alloy of Co, Pt and Cr.

25. The memory cell according to claim 19 wherein the biasing ferromagnetic layer comprises a ferromagnetic film and an antiferromagnetic film in contact with and interfacially exchange coupled with the first ferromagnetic film.

26. The memory cell according to claim 25 wherein the ferromagnetic film comprises an alloy of Ni and Fe, and wherein the antiferromagnetic film comprises an alloy of Ni and Mn.

27. A magnetic memory array comprising:

a substrate;

a first set of parallel electrically conductive write lines formed on the substrate;

a second set of parallel electrically conductive write lines formed on the substrate generally perpendicular to the first set of lines and overlapping the first set of lines, the second set of lines being spaced from the first set of traces in a direction generally perpendicular to the substrate surface to define a plurality of intersection regions;

a plurality of magnetic tunnel junction memory cells, each memory cell being located in an intersection region between the lines and comprising first and second ferromagnetic layers separated by an insulating tunnel barrier, the first ferromagnetic layer having a magnetization direction that is generally fixed in a plane parallel to the substrate surface and the second ferromagnetic layer having a magnetization direction capable of orientation parallel or antiparallel to the magnetization direction of the first ferromagnetic layer, and a biasing ferromagnetic layer for biasing the magnetization direction of the second ferromagnetic layer in a preferred direction substantially parallel or antiparallel to the magnetization direction of the first ferromagnetic layer in the absence of an applied magnetic field;

electrical circuitry coupled to the first and second sets of lines for passing write current through the lines to generate magnetic fields in the vicinity of the second ferromagnetic layers in the magnetic tunnel junction cells to reorient the magnetizations of the second ferromagnetic layers and thereby alter the electrical resistance across the magnetic tunnel junction cells in a direction perpendicular to the substrate.

28. The memory array according to claim 27 wherein the magnetization direction of the biasing ferromagnetic layer is substantially orthogonal to the magnetization direction of the first ferromagnetic layer for providing a transverse bias field to the second ferromagnetic layer.

29. The memory array according to claim 27 wherein the magnetization direction of the biasing ferromagnetic layer is substantially parallel or antiparallel to the magnetization direction of the second ferromagnetic layer in the absence of an applied magnetic field for providing a longitudinal bias field to the second ferromagnetic layer.

30. The memory array according to claim 27 wherein the biasing ferromagnetic layer has a magnetization direction within its plane that is oriented between greater than −90 degrees and less than +90 degrees, where 0 degrees corresponds to a transverse direction generally orthogonal to the magnetization direction of the first ferromagnetic layer and +90 degrees corresponds to a longitudinal direction generally parallel to the magnetization direction of the first ferromagnetic layer, whereby the biasing ferromagnetic layer provides both transverse and longitudinal bias fields to the second ferromagnetic layer.

31. The memory array according to claim 27 further comprising an electrically conductive nonferromagnetic spacer layer separating the biasing ferromagnetic layer from contact with the first and second ferromagnetic layers.

32. The memory array according to claim 27 wherein the biasing ferromagnetic layer comprises a single layer having a magnetization direction approximately equal to or greater than the magnetization direction of the second ferromagnetic layer.

33. The memory array according to claim 32 wherein the single biasing ferromagnetic layer is formed of an alloy comprising Co, Pt and Cr.

34. The memory array according to claim 27 wherein the biasing ferromagnetic layer comprises a bilayer of a first ferromagnetic film and a second ferromagnetic film having a coercivity higher than the coercivity of the first ferromagnetic film.

35. The memory array according to claim 34 wherein the first ferromagnetic film comprises an alloy of Ni and Fe, and wherein the second ferromagnetic film comprises an alloy of Co, Pt and Cr.

36. The memory array according to claim 27 wherein the biasing ferromagnetic layer comprises a ferromagnetic film and an antiferromagnetic film in contact with and interfacially exchange coupled with the first ferromagnetic film.

37. The memory array according to claim 36 wherein the ferromagnetic film comprises an alloy of Ni and Fe, and wherein the antiferromagnetic film comprises an alloy of Ni and Mn.

* * * * *